United States Patent [19]

Phlipot et al.

[11] 4,284,705

[45] Aug. 18, 1981

[54] PHOTOSENSITIVE DIAZO SALT COMPOSITIONS AND LITHOGRAPHIC PLATE COMPRISING SAME

[75] Inventors: Georges A. Phlipot, Paris; Jacques R. G. Haeck, Bonneuil-sur-Marne; Simone J. Kempen, Orly, all of France

[73] Assignee: Eastman Kodak Company, Rochester, N.Y.

[21] Appl. No.: 108,724

[22] Filed: Dec. 31, 1979

Related U.S. Application Data

[62] Division of Ser. No. 924,107, Jul. 12, 1978, Pat. No. 4,215,041.

[30] Foreign Application Priority Data

Sep. 8, 1977 [FR] France .................. 77 24471

[51] Int. Cl.$^3$ ............ G03C 1/52; G03C 1/71; G03C 7/08
[52] U.S. Cl. .................. 430/159; 430/157; 430/160; 430/168; 430/175; 430/302; 430/183; 430/195; 430/286; 430/287
[58] Field of Search .......... 430/175, 183, 194, 195, 430/302, 287, 286; 260/141 R, 141 T, 142

[56] References Cited

U.S. PATENT DOCUMENTS

| 2,528,460 | 10/1950 | Von Glahn et al. ............ 430/183 |
| 2,661,291 | 12/1952 | Slifkin ........................... 430/183 |
| 3,149,972 | 9/1964 | Herrick et al. ............... 430/175 |
| 3,174,860 | 3/1965 | Sus et al. ....................... 430/175 |
| 3,462,271 | 8/1969 | Rauhut et al. ............... 430/183 |
| 3,567,453 | 3/1971 | Borden ......................... 430/175 |
| 3,778,270 | 12/1973 | Roos ............................. 430/176 |
| 3,929,489 | 12/1975 | Arcesi et al. . |
| 4,215,041 | 7/1980 | Phlipot et al. ............... 430/183 |

FOREIGN PATENT DOCUMENTS

| 1572108 | 10/1974 | Fed. Rep. of Germany ......... 430/183 |
| 51-34294 | 9/1976 | Japan .................................. 430/183 |
| 1453398 | 10/1976 | United Kingdom ................. 430/184 |

OTHER PUBLICATIONS

Kosar, J., "Light-Sensitive Systems", J. Wiley & Sons, 1965, p. 212.
Tsunoda et al., J. Appl. Polymer Sci., vol. 8, pp. 1379-1390, 1964.

*Primary Examiner*—Charles L. Bowers, Jr.
*Attorney, Agent, or Firm*—Dana M. Schmidt

[57] ABSTRACT

Diazonium compounds particularly useful for the preparation of lithographic printing plates, a process for the preparation of this compound and printing plate, and for the use of the plate; and a lithographic plate presensitized with this compound, are described.

6 Claims, No Drawings

PHOTOSENSITIVE DIAZO SALT COMPOSITIONS AND LITHOGRAPHIC PLATE COMPRISING SAME

This is a division of application Ser. No. 924,107, filed July 12, 1978 now U.S. Pat. No. 4,215,041.

BACKGROUND OF THE INVENTION

The present invention relates to novel compounds and a photolithographic use of those compounds.

Photosensitive compounds usually used for the preparation of presensitized plates are the condensation products of a carbonyl compound, e.g. an aldehyde, such as formaldehyde, with a diazonium salt of a para-phenylenediamine. These condensation products are usually designated diazo resins. These resins are commonly stabilized by preparing them in the form of soluble salts of a bivalent metal, such as zinc or cadmium, with one or possibly two acid anions.

The diazonium salt of N-ethyl-N-hydroxyethyl-p-phenylenediamine has been disclosed as a weak photohardener for polyvinyl alcohol, J. Appl. Pol. Sci. Vol. 8, page 1379–1381 (1964). However, there is no suggestion in this article that the phenylenediamine diazo salt can be modified further to make a bis compound highly useful in a lithographic plate.

U.S. Pat. No. 3,778,270 describes a photosensitive composition that can be photohardened. This composition comprises a bis-diazonium photosensitive salt and a polymer that can be photocrosslinked in the presence of this bis-diazonium salt in an alkaline medium. The aforementioned photocrosslinkable polymer can be a macromolecular organic colloid comprising hydroxyl or amino groups, or a polymer such as gelatin or poly(vinyl alcohol). These photosensitive compositions are useful for the preparation of presensitized plates.

Patents relating to the background of diazonium compounds in general include U.S. Pat. Nos. 3,778,270 issued Dec. 11, 1973; 3,149,972 issued Sept. 22, 1964; British 1,453,398 published Oct. 20, 1976; German Pat. No. 1,572,108 granted Apr. 14, 1977; and Japanese Publication No. 76/034294.

The lithographic plates prepared with diazonium salts of the prior art have the disadvantage of having printing areas with insufficient affinity for greasy ink. The oleophilic property of these printing areas is not sufficiently strong and, when used on a lithographic printer, the inking of the first copies is insufficient.

SUMMARY OF THE INVENTION

This invention is directed to a lithographic plate and composition comprising said compounds, and methods of preparing and of using the plate.

More specifically, there is provided a diazonium compound corresponding to one of the following general formulas:

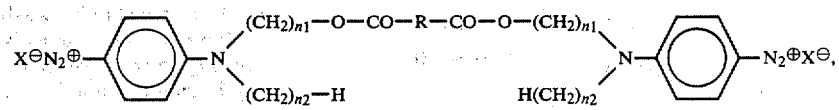
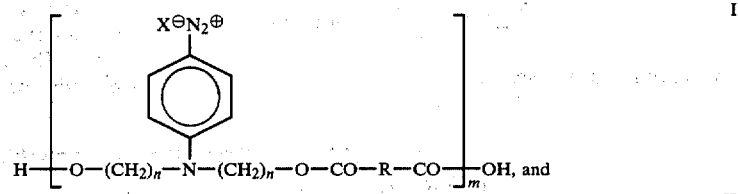
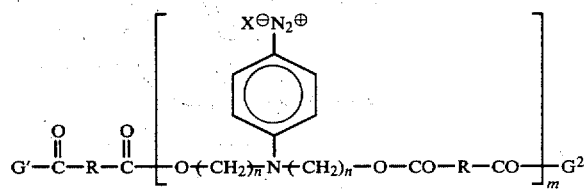

wherein G′ and G² are the same or different and are either OH or

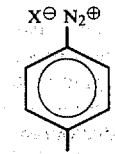

R represents (a) an alkylene radical having 1 to about 12 carbon atoms, an arylene radical having 6 to 10 carbon atoms, an alkylarylene or alkylarylalkylene radical having about 8 to about 16 carbon atoms, (b) a bivalent photocrosslinkable moiety containing ethylenic unsaturation, and having from about 4 to about 30 carbon atoms, or (c) a bivalent group containing an azide function, m is a number between 2 and 5, n, $n_1$ and $n_2$ are the same or different and are whole numbers from 1 to 4, and $X^\ominus$ is an anion.

Such diazonium compounds are found to be photosensitive, so that a lithographic composition of the invention comprises a binder soluble in either water or nonaqueous solvents, and a diazonium compound corresponding to one of the aforesaid formulas I and II.

The diazonium compounds described above can be prepared by the steps of reacting a diacid bis-chloride with a p-amine benzene-diazonium salt containing one or two hydroxyalkyl groups attached to the nitrogen, in an anhydrous organic solvent, at a reaction temperature of between about 25° C. and about 70° C. for a time between about 5 hours and about 12 hours.

DESCRIPTION OF THE PREFERRED EMBODIMENTS

Diazonium compounds according to the invention is obtained preferably by reaction of a diacid bis-chloride, Cl—CO—R—CO—Cl, wherein R is as defined above, with a benzenediazonium salt such as,

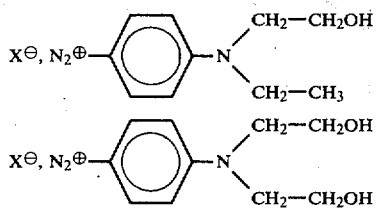

or mixtures of the same.

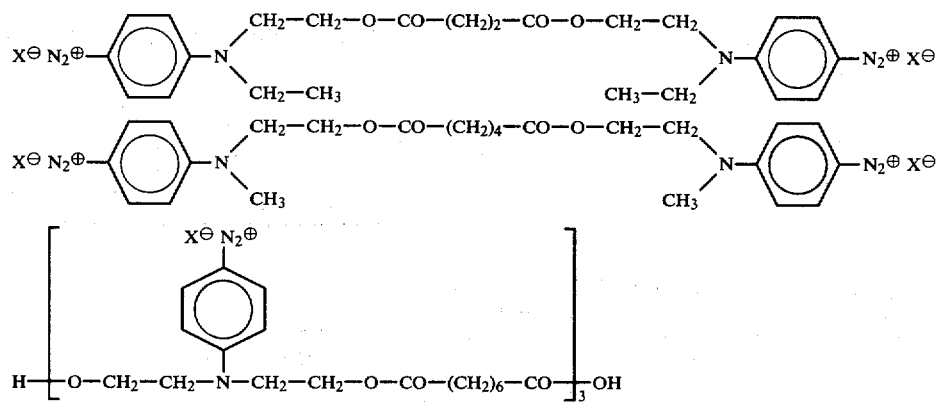

Presensitized plates comprising these compounds are useful, after exposure and washing with water, for the preparation of lithographic plates that yield, on an offset printer, several thousand good-quality copies.

The photosensitive diazonium compounds, according to the invention, are particularly useful to form, after exposure and washing with water, oleophilic surfaces useful in photolithography. Such compounds correspond to one of the general formulas noted above as I, II and III.
wherein $G^1$ and $G^2$ are the same or different and are either OH or

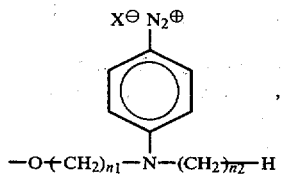

R represents (a) a bivalent alkylene radical having 1 to about 12 carbon atoms, an arylene radical having 6 to 10 carbon atoms, an alkylarylene or alkylarylalkylene radical having about 8 to about 16 carbon atoms, (b) an unsaturated bivalent moiety that can be photocrosslinked, having from about 4 to about 30 carbon atoms, or (c) a bivalent group containing an azide function, m is a number between 2 and 5, n, $n_1$, and $n_2$ are the same or different and are whole numbers from 1 to 4, and $X^\ominus$ is an anion.

The photosensitive diazonium compounds according to the invention are particularly of interest for the preparation of presensitized plates, because they are very soluble in aqueous organic solvents, e.g. in organic solvents containing up to about 80% of water. After exposure, in the exposed areas of a presensitized plate the compounds of the invention form water-insoluble organic compounds having an oleophilic property such that the plates are easily inkable. In the unexposed areas, the residual diazonium photosensitive compounds are easily removable by washing with water.

Preferred photosensitive diazonium compounds according to the invention, corresponding to the preceding Formulas I and II, are those in which the radical R represents an alkylene radical having 1 to about 8 carbon atoms, and n, $n_1$ and $n_2$ represent the whole number 1 or 2. Examples of such photosensitive diazonium compounds comprise the following compounds:

Other preferred photosensitive diazonium compounds according to the invention, corresponding to the preceding Formulas I, II and III, are those in which the bivalent group R is a group comprising one or more ethylenic unsaturations that can be photocrosslinked. Such a group can be radicals derived from the cinnamylidene radical, such as:

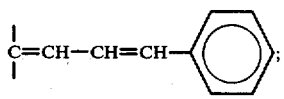

di(p-vinyl)phenylene radicals, such as:

radicals derived from stilbene, such as:

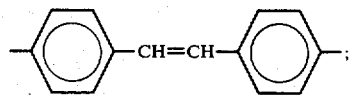

radicals derived from vinylanthracene, such as:

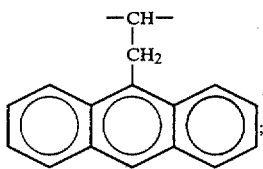

radicals containing α-ethylene ketone functions, such as the radical derived from dibenzylideneacetone:

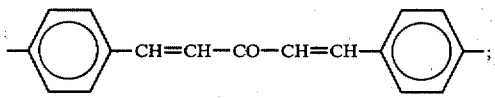

radicals derived from dibenzylidenecyclohexanone, such as:

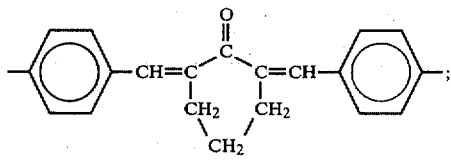

and radicals derived from benzylideneacetophenone, such as:

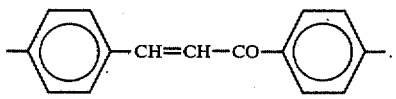

In order to prepare preferred forms of the photosensitive diazonium compounds according to the invention, one can react the aforenoted diacid bis-chloride with a p-amino-benzene-diazonium salt containing 1 or 2 hydroxyalkyl groups attached to the nitrogen, according to one of the two following reaction diagrams A and B:

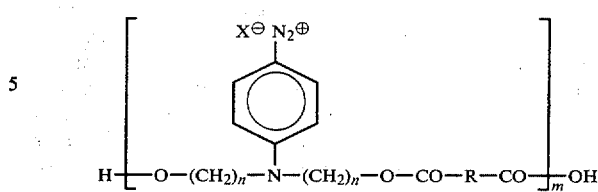

wherein R, m, n, $n_1$, $n_2$, and $X^\ominus$ have the aforedescribed meanings.

The preceding reactions can be carried out in an anhydrous organic solvent, such as trifluoroacetic acid, at a temperature between about 25° C. and about 70° C., for a period between about 5 hours and about 12 hours.

The presensitized plates according to the invention comprise a support to which a layer of photosensitive composition is applied comprising one of the aforedescribed diazonium compounds. Preferably the photosensitive composition is coated from a solution of one of the aforedescribed diazonium compounds in a mixture of water and a hydrophilic organic solvent, such as an alcohol having 1 to about 3 carbon atoms, the amount of water being between approximately 20% and 80% of the total weight of the solvent mixture. Dilute solutions are preferred, advantageously solutions containing about 0.5 to about 5% by weight of photosensitive diazonium compound.

The photosensitive composition can be applied to a support, with or without a binder, with a diazonium content that can vary between about 1 and about 20 mg/dm². Both water-soluble binders and those soluble in nonaqueous solvents, e.g., so-called organic solvents, can be used.

Suitable supports for the preparation of presensitized plates according to the invention comprise metallic supports such as aluminum sheets, synthetic polymer supports such as cellulose-acetate films, vinyl polymers, polyolefins, polyesters, etc., paper supports having advantageously a great resistance in the wet state, e.g. paper supports coated on both sides with a layer of a polyolefin, such as polyethylene, that has been submit-

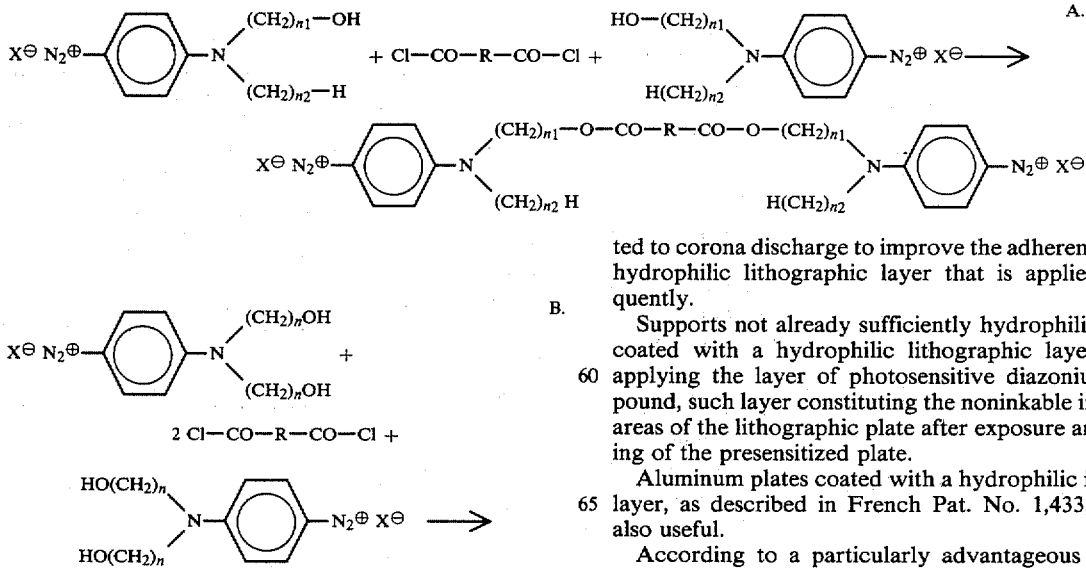

ted to corona discharge to improve the adherence of the hydrophilic lithographic layer that is applied subsequently.

Supports not already sufficiently hydrophilic can be coated with a hydrophilic lithographic layer before applying the layer of photosensitive diazonium compound, such layer constituting the noninkable imageless areas of the lithographic plate after exposure and washing of the presensitized plate.

Aluminum plates coated with a hydrophilic insoluble layer, as described in French Pat. No. 1,433,616; are also useful.

According to a particularly advantageous embodiment, a paper support can be used, coated with polyethylene, as described, e.g., in British Pat. No. 1,111,684, submitted to an electron bombardment, then coated with a hydrophilic lithographic layer comprising a binder, such as poly(vinyl alcohol), colloidal silica, larger inert particles such as silica or alumina particles, and advantageously the hydrolysis product of tetraethyl orthosilicate, this hydrophilic lithographic layer being as described, for example, in French Pat. No. 2,167,655.

According to another embodiment, a hydrophilic lithographic layer can be obtained by application of a composition prepared by hydrolyzing an ester of orthotitanic acid in a dilute hydrogen peroxide solution, as described in French Pat. Nos. 1,433,616 and 1,497,404.

According to another particularly advantageous embodiment, a hydrophilic lithographic layer can be used that is adherent to the support, resistant to wear, and contains an aqueous dispersion of titanium dioxide and hydrolyzed tetraethyl orthosilicate, in an aqueous polyvinyl alcohol solution.

According to another embodiment, a hydrophilic lithographic layer can be prepared by applying to a support an aqueous dispersion of colloidal silica and titanium dioxide in an aqueous solution of a copolymer of acrylamide and 2-acetoacetoxyethyl methacrylate, as described in French Pat. No. 2,121,057.

The following examples further illustrate the invention.

EXAMPLE 1

Preparation of the condensation product of an N-ethyl-N-beta-hydroxyethyl-p-phenylenediamine diazonium salt with succinoyl chloride.

The following reagents were placed in a 250 ml flask fitted with a reflux condenser connected to a moisture absorbing trap consisting of a calcium chloride tube:

| | |
|---|---|
| Trifluoroacetic acid | 50 ml |
| p-(N-ethyl-N-beta-hydroxy ethyl)aminobenzene diazonium chlorozincate | 5.9 g |
| Succinoyl chloride | 1.55 g |

The mixture was stirred until the reagents were completely dissolved, then it was maintained for 5 hours at 50° C. and for 1 hour at 70° C. Then the solution was poured into a volume of diethyl ether equal to ten times its own volume to precipitate the reaction product. The resulting precipitate was filtered off, rinsed with ether, then with xylene, and dried in a desiccator under vacuum.

EXAMPLE 2

Preparation and use of a plate presensitized with the photosensitive compound of Example 1.

A photosensitive composition was prepared by dissolving 0.45 g of the photosensitive compound prepared in Example 1 in a mixture comprising 10 ml of water and 20 ml of ethanol.

This composition was used to form a lithographic plate by coating it onto a support prepared as follows: a polyethylene-coated paper base was subjected to a corona discharge, and then coated with a hydrophilic lithographic layer prepared from the dispersion obtained by mixing the following components:

| | | | |
|---|---|---|---|
| 1. | Titanium dioxide | 350 g | |
| | Water | 700 ml | |
| 2. | Polyvinyl alcohol | 110 g | |
| | Water | 2 l | |
| 3. | Hydrolyzed tetraethyl orthosilicate prepared from: Tetraethyl orthosilicate | 600 ml | |
| | Water | 100 ml | |
| | 2% hydrochloric acid solution | 50 ml | |

Thereafter the photosensitive composition was applied.

The presensitized plate was dried, then exposed for 2 minutes behind a line negative to a set of 160 W actinic tubes placed at 20 cm.

The unexposed areas were then washed off with water for about 10 seconds. A lithographic plate was thus obtained which carried a resist exhibiting a very much marked oleophilic character that readily accepted oily printing inks.

The plate was used on an offset lithographic press and several thousand good quality prints were obtained and, above all, inking was excellent from the first copies.

EXAMPLE 3

Preparation of the condensation product of an N-ethyl-N-beta-hydroxyethyl-p-phenylenediamine diazonium salt with sebacoyl chloride.

The apparatus of Example 1 was used, but with the following reagents:

| | |
|---|---|
| Trifluoroacetic acid | 50 ml |
| p-(N-ethyl-N-beta-hydroxyethyl)-aminobenzenediazonium chlorozincate | 5.9 g |
| Sebacoyl chloride | 2.39 g |

The mixture was dissolved, then the solution was heated to 50° C. and maintained at this temperature for 7 h, 30 mn. It was allowed to cool. Then the solution was poured into 500 ml of diethyl ether in order to precipitate the reaction product. The resulting precipitate was filtered off, drained, rinsed with ether, then with xylene, and finally dried under a vacuum.

EXAMPLE 4

Preparation and use of a plate presensitized with the photosensitive compound of Example 3.

The procedure of Example 2 was repeated with the photosensitive compound of Example 3 and results similar to those of Example 2 were obtained.

EXAMPLE 5

Preparation of the condensation product of an N-ethyl-N-beta-hydroxyethyl-p-phenylenediamine diazonium salt with cinnamylidene malonyl chloride.

The procedure of Example 1 was used but with the following reagents:

| | |
|---|---|
| Trifluoroacetic acid | 50 ml |
| p-(N-ethyl-N-beta-hydroxethyl)aminobenzenediazonium chlorozincate | 5.9 g |
| Cinnamylidene malonyl chloride | 2.55 g |

The mixture was stirred until the reagents were completely dissolved, then the mixture was maintained at 50° C. for 5 hours and then heated at 70° C. for 1 hour. The solution was then poured into a volume of diethyl ether equal to ten times its own volume to precipitate the reaction product. The resulting precipitate was filtered off, rinsed with ether and dried in a desiccator under vacuum.

The U.V. spectrum of the resulting product showed an absorption peak at 378 nm corresponding to the diazonium salt and a peak at 322 nm corresponding to the cinnamylidene malonic group. The overlapping of the two absorption zones was small and the light sensitivity of the product was very good.

EXAMPLE 6

Preparation and use of a plate presensitized by the photosensitive compound of Example 5.

0.25 g of the photosensitive compound prepared in Example 5 was dissolved in 18 ml of water. A small insoluble fraction was removed by centrifugation, then the centrifuged solution was coated on a lithographic plate such as is described in Example 2.

The presensitized plate was dried, exposed and developed as described in Example 2. A lithographic plate was thus obtained with a very much marked oleophilic character.

The lithographic plate was used on an offset press and several thousand prints were obtained whose first copies were well inked.

EXAMPLE 7

Preparation of the condensation product of an N-methyl-N-beta-hydroxyethyl-p-phenylenediamine diazonium salt with cinnamylidene malonyl chloride.

The following reagents were placed in a 50 ml flask fitted with a stirrer and a reflux condenser, as described in Example 1:

| | | |
|---|---|---|
| Trifluoroacetic acid | 10 | ml |
| p-(N-methyl-N-beta-hydroxyethyl)-aminobenzenediazonium chlorozincate | 0.9 | g |
| Cinnamylidene malonyl chloride | 0.4 | g |

The reagents were dissolved by stirring at room temperature, then this temperature was maintained for 3 hours and the mixture was heated at 50° C. for 5 hours. It was allowed to cool, then the reaction product was separated as described in Example 1.

EXAMPLE 8

The procedure of Example 6 was repeated, but the photosensitive compound of Example 7 was used. Results similar to those of Example 6 were obtained.

EXAMPLE 9

Preparation of the condensation product of an N-ethyl-N-beta-hydroxyethyl-p-phenylenediamine diazonium salt with p-phenylenediacryloyl chloride.

The procedure of Example 1 was used, but with the following reagents:

| | | |
|---|---|---|
| Trifluoroacetic acid | 50 | ml |
| p-(N-ethyl-N-beta-hydroxyethyl)-aminobenzene diazonium chlorozincate | 5.9 | g |
| p-phenylenediacryloyl chloride | 2.55 | g |

The reagents were dissolved, then the solution was heated to 50° C. and this temperature was maintained for 7 h, 30 mn. It was allowed to cool, then the solution was poured into 500 ml of diethyl ether to precipitate the reaction product. The precipitate was filtered off, drained, washed with ether, then with xylene, and it was dried under a vacuum.

EXAMPLE 10

The procedure of Example 6 was repeated, but the photosensitive compound of Example 9 was used. Results similar to those of Example 6 were obtained.

EXAMPLE 11

Preparation of the condensation product of an N,N-di(beta-hydroxyethyl)-p-phenylenediamine diazonium salt with cinnamylidene methyl chloride. The procedure described in Example 1 was used, but with the following materials:

| | | |
|---|---|---|
| Trifluoroacetic acid | 20 | ml |
| p-(N-,N-di-beta-hydroxyethyl)-aminobenzenediazonium chlorozincate | 1.75 | g |
| Cinnamylidene malonyl chloride | 1.27 | g |

The mixture was stirred until it was dissolved, then the temperature was raised to 50° C. and maintained for 5 hours. The reaction product was separated as described in Example 9.

EXAMPLE 12

Preparation and use of a plate presensitized with the photosensitive compound of Example 11.

The procedure of Example 6 was repeated, but the photosensitive compound of Example 11 was used. Results similar to those of Example 6 were obtained.

The invention has been described in detail with particular reference to certain preferred embodiments thereof, but it will be understood that variations and modifications can be effected within the spirit and scope of the invention.

What is claimed is:

1. A presensitized lithographic plate comprising, on a support, provided with a hydrophilic surface a layer including a diazonium compound corresponding to one of the following general formulas:

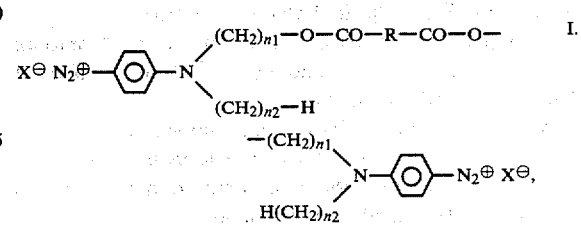

-continued

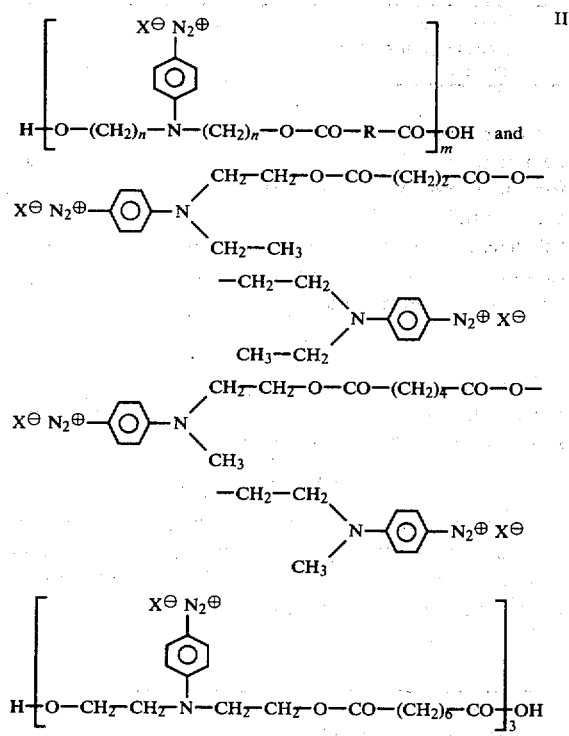

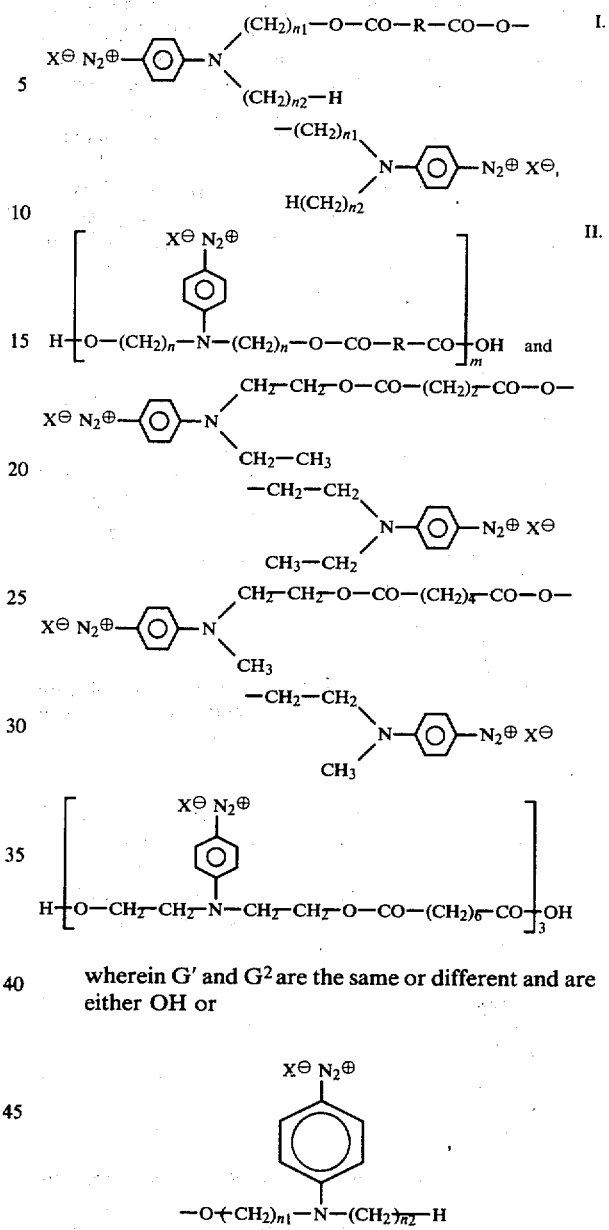

wherein G' and G² are the same or different and are either OH or

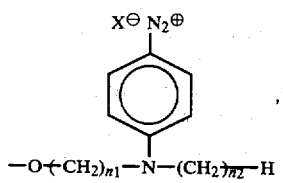

R represents (a) alkylene having 1 to 12 carbon atoms, arylene having 6 to 10 carbon atoms, alkylarylene or alkylarylkylene having 8 to 16 carbon atoms, (b) a photocrosslinkable moiety containing ethylenic unsaturation, and having from 4 to 30 carbon atoms, or (c) a group containing an azide, m is a number between 2 and 5, n, $n_1$ and $n_2$ are the same or different and are whole numbers from 1 to 4, and $X^\ominus$ is an anion.

2. A plate as defined in claim 1, wherein said support comprises paper coated with polyethylene and a hydrophilic lithographic layer comprising an aqueous dispersion of titanium dioxide and hydrolyzed tetraethyl orthosilicate, in a polyvinyl alcohol solution.

3. A plate as defined in claim 1, wherein the amount of said diazonium compound is between about 1 mg/dm² and about 20 mg/dm².

4. A lithographic composition comprising, a binder soluble in water or nonaqueous solvents, and a diazonium compound corresponding to one of the following general formulas:

wherein G' and G² are the same or different and are either OH or

R represents (a) alkylene having 1 to 12 carbon atoms, arylene having 6 to 10 carbon atoms, alkylarylene or alkylarylkylene having 8 to 16 carbon atoms, (b) a photocrosslinkable moiety containing ethylenic unsaturation, and having from 4 to 30 carbon atoms, or (c) a group containing an azide, m is a number between 2 and 5, n, $n_1$, and $n_2$ are the same or different and are whole numbers from 1 to 4, and $X^\ominus$ is an anion.

5. A method of forming a lithographic printing plate, comprising the steps of (a) imagewise exposing a presensitized plate comprising a support provided with a hydrophilic surface, and on the support, a layer including a diazonium compound corresponding to one of the following general formulas:

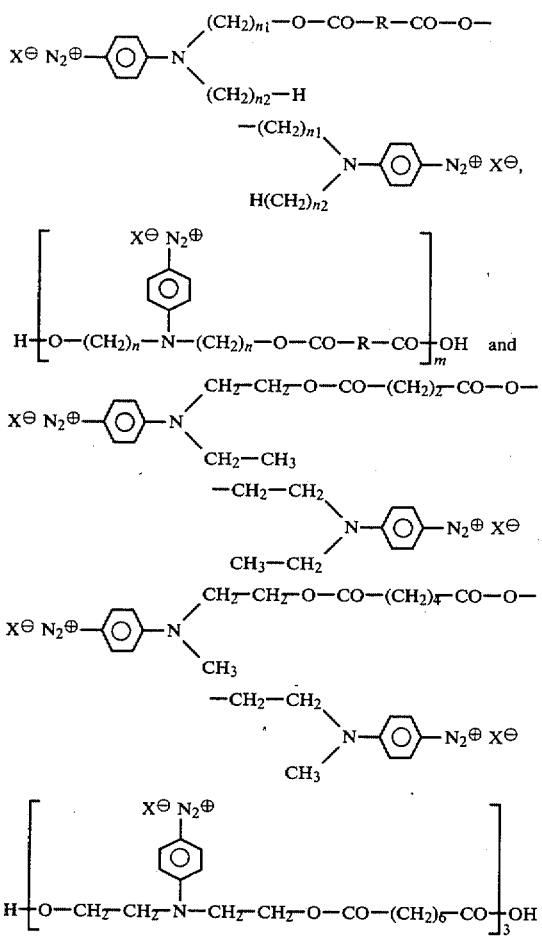

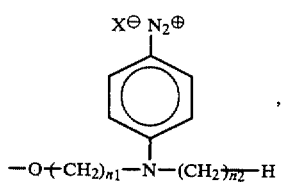

wherein G' and G² are the same or different and are either OH or

R represents (a) alkylene having 1 to 12 carbon atoms, arylene having 6 to 10 carbon atoms, alkylarylene or alkylarylkylene having 8 to 16 carbon atoms, (b) a photocrosslinkable moiety containing ethylenic unsaturation, and having from 4 to 30 carbon atoms, or (c) a group containing an azide, m is a number between 2 and 5, n, $n_1$ and $n_2$ are the same or different and are whole numbers from 1 to 4, and $X^{\ominus}$ is an anion, and (b) developing said plate by removing the unexposed portions of said layer.

6. A method of forming a presensitized lithographic plate, comprising the steps of (a) forming on a support provided with a hydrophilic surface, a layer including a diazonium compound corresponding to one of the following general formulas:

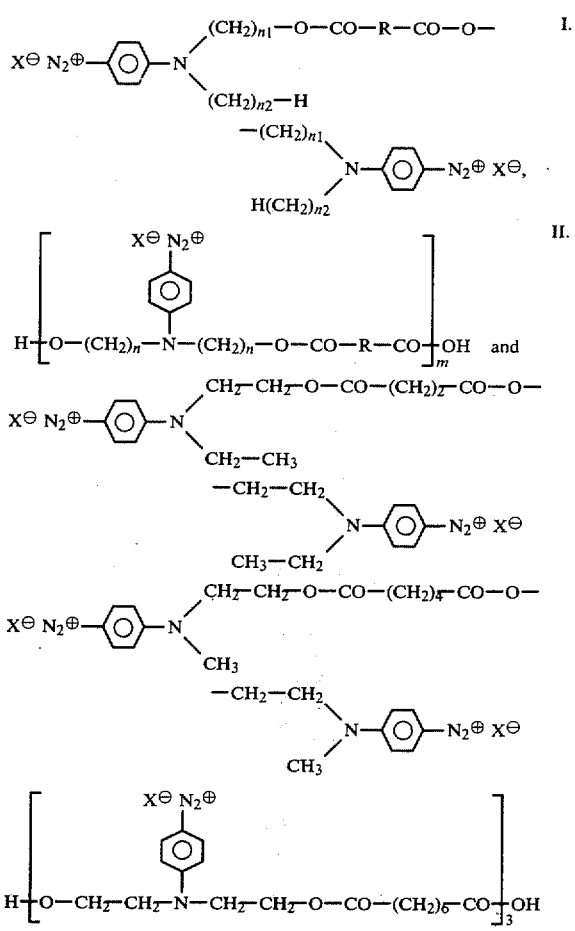

wherein G' and G² are the same or different and are either OH or

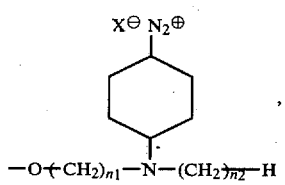

R represents (a) alkylene having 1 to 12 carbon atoms, arylene having 6 to 10 carbon atoms, alkylarylene or alkylarylkylene having 8 to 16 carbon atoms, (b) a photocrosslinkable moiety containing ethylenic unsaturation, and having from 4 to 30 carbon atoms, or (c) a group containing an azide, m is a number between 2 and 5, n, $n_1$ and $n_2$ are the same or different and are whole numbers from 1 to 4, and $X^{\ominus}$ is an anion; and (b) drying said layer.

* * * * *

UNITED STATES PATENT AND TRADEMARK OFFICE
CERTIFICATE OF CORRECTION

PATENT NO. : 4,284,705

DATED : August 18, 1981

INVENTOR(S) : Georges A. Phlipot, Jacques R. G. Haeck and Simone J. Kempen

It is certified that error appears in the above-identified patent and that said Letters Patent are hereby corrected as shown below:

Col. 11, lines 9-30, delete that part of structure II and substitute therefor, new structure III as follows:

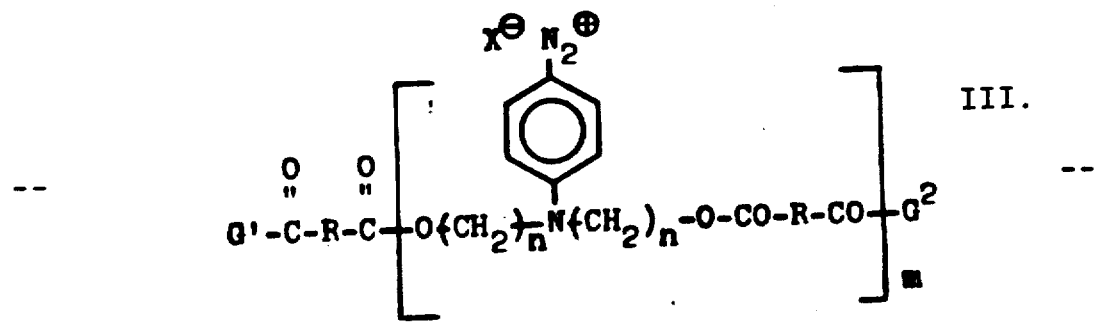

Col. 12, lines 17-39, delete that part of structure II and substitute therefor, new structure III as follows:

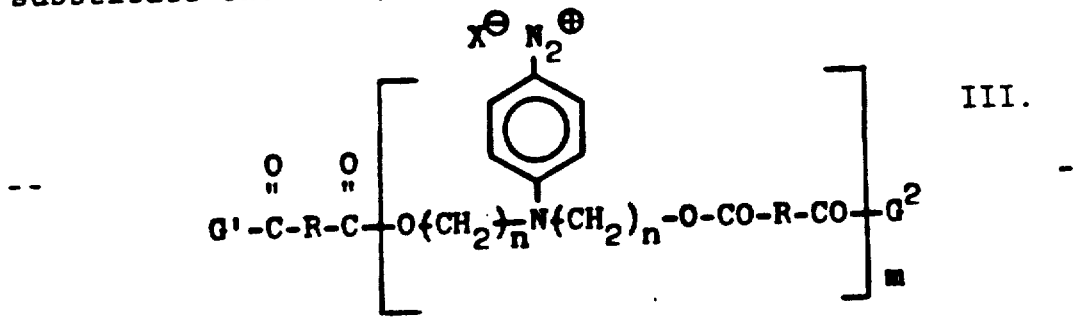

UNITED STATES PATENT AND TRADEMARK OFFICE
CERTIFICATE OF CORRECTION

PATENT NO. : 4,284,705
DATED : August 18, 1981
INVENTOR(S) : Georges A. Phlipot, Jacques R. G. Haeck and Simone J. Kempen It is certified that error appears in the above-identified patent and that said Letters Patent are hereby corrected as shown below:

Col. 13, lines 17-38, delete that part of structure II and substitute therefor, new structure III as follows:

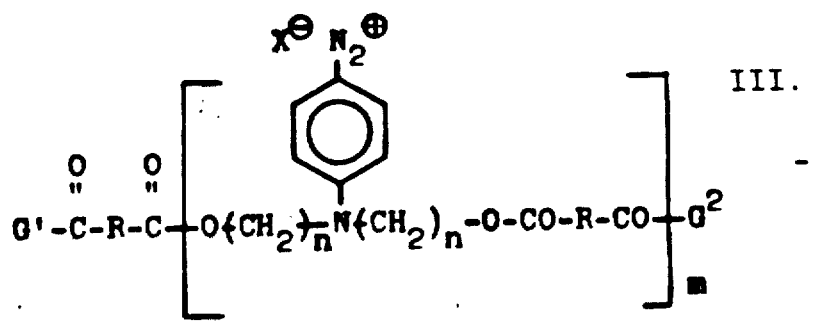

UNITED STATES PATENT AND TRADEMARK OFFICE
CERTIFICATE OF CORRECTION

PATENT NO. : 4,284,705

DATED : August 18, 1981

INVENTOR(S) : Georges A. Phlipot, Jacques R. G. Haeck and Simone J. Kempen

It is certified that error appears in the above-identified patent and that said Letters Patent are hereby corrected as shown below:

Col. 14, lines 20-42, delete that part of structure II and substitute therefor, new structure III as follows:

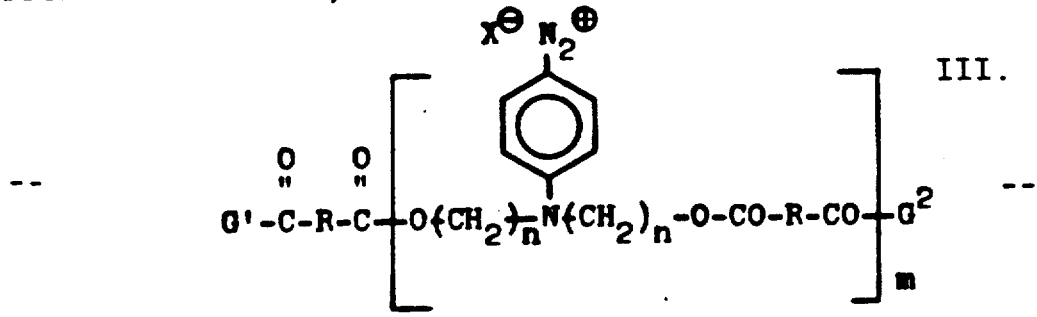

Signed and Sealed this

Eighth Day of June 1982

[SEAL]

Attest:

GERALD J. MOSSINGHOFF

Attesting Officer    Commissioner of Patents and Trademarks